United States Patent
Kim et al.

(10) Patent No.: US 10,608,067 B2
(45) Date of Patent: *Mar. 31, 2020

(54) TOP EMISSION DEVICE AND ORGANIC LIGHT-EMITTING DIODE DISPLAY DEVICE

(71) Applicant: SAMSUNG DISPLAY CO., LTD., Yongin, Gyeonggi-Do (KR)

(72) Inventors: Hee Kyung Kim, Busan (KR); Yun Mo Chung, Yongin-si (KR); Byoung Ki Kim, Seoul (KR); Young Jun Shin, Seongnam-si (KR); Soo Ran Park, Suwon-si (KR); Kwang Sub Shin, Seongnam-si (KR)

(73) Assignee: SAMSUNG ELECTRONICS CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/044,996

(22) Filed: Jul. 25, 2018

(65) Prior Publication Data

US 2018/0331168 A1 Nov. 15, 2018

Related U.S. Application Data

(63) Continuation of application No. 15/611,459, filed on Jun. 1, 2017, now Pat. No. 10,050,096, which is a (Continued)

(30) Foreign Application Priority Data

Feb. 9, 2015 (KR) .................. 10-2015-0019247
Feb. 9, 2015 (KR) .................. 10-2015-0019251

(51) Int. Cl.
*H01L 27/32* (2006.01)
*H01L 51/52* (2006.01)

(52) U.S. Cl.
CPC ........ *H01L 27/3269* (2013.01); *H01L 51/529* (2013.01); *H01L 27/3227* (2013.01); *H01L 2251/5315* (2013.01)

(58) Field of Classification Search
None
See application file for complete search history.

(56) References Cited

U.S. PATENT DOCUMENTS 9,070,648 B2   6/2015   De Jong et al.
9,685,493 B2 * 6/2017   Kim .................. H01L 27/3269
(Continued)

FOREIGN PATENT DOCUMENTS

CN   101847343    9/2010
JP   2005173184   6/2005
(Continued)

*Primary Examiner* — J. E. Schoenholtz
(74) *Attorney, Agent, or Firm* — F. Chau & Associates, LLC

(57) ABSTRACT

An organic light-emitting diode display device includes a first substrate that includes a display region with a plurality of pixels and a non-display region in a periphery of the display region, a first electrode disposed on the first substrate, a second electrode opposed to the first electrode, an organic light-emitting layer disposed between the first electrode and the second electrode, and at least one light sensing member disposed on a rear surface of the first substrate that overlaps the display region.

11 Claims, 17 Drawing Sheets

Related U.S. Application Data continuation of application No. 15/018,335, filed on Feb. 8, 2016, now Pat. No. 9,685,493.

(56) References Cited

U.S. PATENT DOCUMENTS

| | | | |
|---|---|---|---|
| 2008/0054275 A1* | 3/2008 | Vogel | H01L 27/3227 257/84 |
| 2009/0002341 A1 | 1/2009 | Saito et al. | |
| 2013/0343087 A1 | 12/2013 | Huang | |
| 2014/0009960 A1 | 1/2014 | Miyamoto et al. | |
| 2014/0133184 A1 | 5/2014 | Zhou | |
| 2014/0183342 A1 | 7/2014 | Shedletsky et al. | |
| 2015/0318430 A1 | 11/2015 | Schicktanz et al. | |
| 2016/0154178 A1 | 6/2016 | Jaeger et al. | |
| 2016/0233283 A1 | 8/2016 | Kim et al. | |
| 2017/0214004 A1 | 7/2017 | Shedletsky et al. | |
| 2017/0271428 A1 | 9/2017 | Kim et al. | |

FOREIGN PATENT DOCUMENTS

| | | |
|---|---|---|
| JP | 2006351314 | 12/2006 |
| JP | 20100078653 | 4/2010 |
| JP | 20100230999 | 10/2010 |
| JP | 2010266326 | 11/2010 |
| JP | 2011043729 | 3/2011 |
| KR | 20060112996 | 11/2006 |
| KR | 20120062284 | 6/2012 |
| KR | 20120113500 | 10/2012 |
| KR | 20130012507 | 2/2013 |
| KR | 20140033980 | 3/2014 |

* cited by examiner

503

504

TOP EMISSION DEVICE AND ORGANIC LIGHT-EMITTING DIODE DISPLAY DEVICE

CROSS-REFERENCE TO RELATED APPLICATION

This application is a continuation of U.S. application Ser. No. 15/611,459, filed on Jun. 1, 2017, which is a continuation of U.S. application Ser. No. 15/018,335, filed on Feb. 8, 2016 in the U.S. Patent and Trademark Office, which in turn claims priority under 35 U.S.C. § 119 from, and the benefit of, Korean Patent Application No. 10-2015-0019251 filed on Feb. 9, 2015 and Korean Patent Application No. 10-2015-0019247 filed on Feb. 9, 2015 in the Korean Intellectual Property Office, the contents of which are herein incorporated by reference in their entireties.

BACKGROUND

1. Technical Field

Embodiments of the present disclosure are directed to a top emission device and an organic light-emitting diode display device, and more particularly, to a top emission device and a top emission type organic light-emitting diode display device emitting light mainly to a front surface thereof.

2. Discussion of the Related Art

Light emitting devices, which are devices that provide light, are used in the fields of lightings or displays. For example, an organic light-emitting diode display device can include a plurality of organic light-emitting devices and can control the amount of light emitted from the respective organic light-emitting devices to display an image. A light emitting layer of a organic light-emitting device emits light through two surfaces thereof, and if a screen is viewed in one direction, the device may be provided with a reflective electrode or a reflective layer to reflect light emitted therefrom in a screen display direction.

A case in which an organic light-emitting device is disposed in front of a substrate, and light is emitted in a direction toward the substrate is commonly referred to as 'bottom emission', while a case in which light is emitted in a front direction that is opposite to the direction toward the substrate is commonly referred to as 'top emission'. A bottom emission type organic light-emitting diode display device may employ a top electrode of an organic light-emitting device as a reflective electrode to emit light to a rear surface thereof. On the other hand, a top emission type organic light-emitting diode display device may include a reflective electrode or a reflective layer in a lower electrode of an organic light-emitting device.

In addition, a degree of degradation in an organic light-emitting diode display device may vary depending on how much current accumulates in each pixel. If degradation has been detected so that the current provided to a corresponding pixel can be compensated, deterioration of image quality due to the degradation may be prevented. To this end, the luminance of emitted light should be determined.

For a bottom emission type display device, since light that is laterally leaking may be reflected from the interior of a display panel and may propagate laterally through the display panel, light emitted from pixels may be detected when an light sensor is provided on a side surface of the display panel. On the basis of this, a pixel light emission intensity can be estimated. However, for a top emission type display device, since a transparent electrode or a translucent electrode is used as a top electrode, the intensity of laterally propagating light may be low. Thus, even if a light sensor is installed on a side surface of the display panel, it may not precisely detect and estimate the light intensity emitted from the pixels.

SUMMARY

Embodiments of the present disclosure can provide an organic light-emitting diode display device in which a luminance of light emitted from a pixel may be easily sensed.

Embodiments of the present disclosure can also provide a top emission device in which a luminance of emitted light may be easily sensed.

According to an embodiment of the present inventive concept, there is provided an organic light-emitting diode display device comprising: a first substrate that includes a display region with a plurality of pixels and a non-display region in a periphery of the display region; a first electrode disposed on the first substrate; a second electrode opposed to the first electrode; an organic light-emitting layer disposed between the first electrode and the second electrode; and at least one light sensing member disposed on a rear surface of the first substrate that overlaps the display region.

The light sensing member may include a light sensor and a light collecting member that transmits light received from the first substrate to the light sensor.

The light collecting member may include a light collecting body and a light-modulating structure disposed in the light collecting body.

The light sensor may be disposed adjacent to one side of the light collecting body.

The light-modulating structure may include a plurality of prism patterns that correspond to the plurality of pixels.

The prism patterns may be disposed along each column or row of the pixels corresponding thereto in a one-to-one correspondence.

The light-modulating structure may have a single continuous sloped surface.

An inclination angle of the sloped surface may decrease with decreasing distance to the light sensor.

The light-modulating structure may include alternating first and second surfaces that have different inclination angles.

A width of a repeating unit of the first surface and the second surface may be identical to a pitch of the pixels corresponding to the repeating unit.

A top surface of the light collecting body may be a light input surface, a side surface of the light collecting body adjacent to the light sensor may be a light output surface, and the light collecting member may further include a reflective member disposed on those surfaces other than the light input surface and the light output surface of the light collecting body.

The light sensor may be disposed on a rear surface adjacent to one side of the light collecting body.

The light-modulating structure may include a first light path changing structure that changes a light path to a horizontal direction and a second light path changing structure that changes a light path to a vertical direction.

A plurality of light sensing members may be provided that are spaced apart from each other.

The display region may include a central portion and a circumferential portion surrounding the central portion, and the light sensing member may be disposed in the circumferential portion of the display region.

The circumferential portion may include a degradation-expected region, and the light sensing member may at least partially overlap the degradation-expected region.

The display region may further include a comparative region adjacent to the degradation-expected region, the light collecting member may overlap the degradation-expected region, and the light sensor may overlap the comparative region.

The organic light-emitting diode display device may further comprise a heat radiating member disposed on the rear surface of the first substrate.

The heat radiating member may include a hole, and the light sensing member may be inserted into the hole and is disposed adjacent to the rear surface of the first substrate.

The organic light-emitting diode display device may further comprise an adhesive member disposed between the first substrate and the light sensing member.

According to another embodiment of the present inventive concept, there is provided a top emission device comprising: a bottom device unit; a top device unit opposed to the bottom device unit; a light emitting device unit interposed between the bottom device unit and the top device unit; and at least one light sensing member disposed in a rear of the bottom device unit that overlaps a light transmitting region of the top device unit.

The light sensing member may include a light sensor and a light collecting member that transmits light received from the bottom device unit to the light sensor.

The light collecting member may include a light collecting body and a light-modulating structure disposed in the light collecting body.

A plurality of light sensing members may be provided that are spaced apart from each other.

The light sensing member may at least partially overlap a degradation-expected region in the light emitting device unit.

The top emission device may further comprise a heat radiating member disposed on the rear surface of the first substrate and that includes a hole, wherein the light sensing member is inserted into the hole and is disposed adjacent to the rear surface of the first substrate.

According to another embodiment of the present inventive concept, there is provided an organic light-emitting diode display device, comprising a first substrate that includes a display region with a plurality of pixels and a non-display region in a periphery of the display region; and at least one light sensing member disposed on a rear surface of the first substrate that overlaps the display region. The light sensing member includes a light sensor and a light collecting member that transmits light received from the first substrate to the light sensor, and the light collecting member includes a light collecting body and a light-modulating structure disposed in the light collecting body.

The organic light-emitting diode display device may further include a first electrode disposed on the first substrate, a second electrode opposed to the first electrode, and an organic light-emitting layer disposed between the first electrode and the second electrode.

DETAILED DESCRIPTION

Features of embodiments of the present disclosure and methods of accomplishing the same may be understood more readily by reference to the following detailed description of exemplary embodiments and the accompanying drawings. Embodiments of the present disclosure may, however, be embodied in many different forms and should not be construed as being limited to the embodiments set forth herein.

It will be understood that when an element or layer is referred to as being "on" another element or layer, it can be directly on the other element or layer or intervening elements or layers may be present. Like numbers may refer to like elements throughout.

In the specification, a light emitting device refers to a device providing light and for example, may include a lighting device or a display device such as an organic light-emitting diode display device, an inorganic light-emitting diode display device, a plasma display device, etc., displaying an image using light.

Hereinafter, exemplary embodiments of the present disclosure will be described with reference to the drawings.

Figure 1:
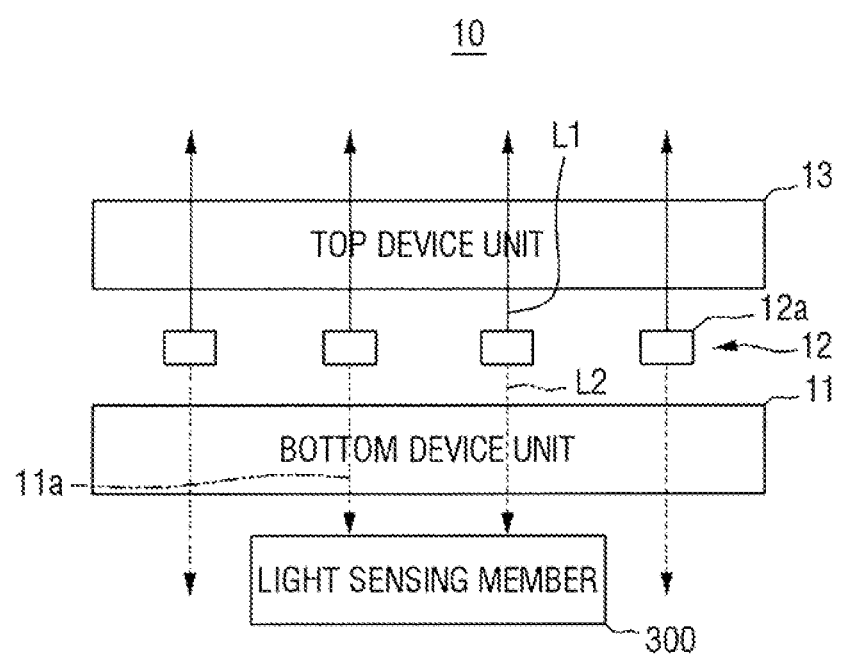
FIG. 1 is a schematic diagram of a top emission device according to an exemplary embodiment of the present disclosure.

FIG. 1 is a schematic diagram of a top emission device according to an exemplary embodiment of the present disclosure. Referring to FIG. 1, a top emission device 10 includes a bottom device unit 11, a light emitting device unit 12, a top device unit 13, and a light sensing member 300.

In the specification, the term 'single-sided light emission' refers to emission of light mainly to one of two surfaces of a device. In addition, the term 'top emission' refers to emission of light mainly to a front surface of front and rear surfaces. Here, the emission of light mainly to the front surface means that the amount of light emitted to the front surface is greater than the amount of light emitted to the rear surface, and for example, corresponds to a case in which 70% or more or 90% or more of a total light emission amount is emitted to the front surface.

The light emitting device unit 12 may include at least one light emitting device 12a. The light emitting device 12a may be, for example, an organic light-emitting device, but the present disclosure is not limited thereto.

For top emission, a single-sided light emitting device may be used as the light emitting device 12a. Cases of a single-sided light emitting device include a device that emits light to a single surface by appropriately including an optical member although the device may emit light to two surfaces, as well as a device that itself emits light to a single surface. For example, a top emission type organic light-emitting device may emit light to two surfaces thereof, but mostly emits light to a front surface thereof by adjusting electrode properties and transmittance, reflectance, etc. Therefore, a top emission type organic light-emitting device may be interpreted as corresponding to a single-sided light emitting device.

According to an embodiment, the bottom device unit 11 is disposed behind the light emitting device unit 12, and the top device unit 13 is disposed in front of the light emitting device unit 12. The light emitting device unit 12 is interposed between the bottom device unit 11 and the top device unit 13 for protection.

According to an embodiment, a light transmitting path 11a through the bottom device unit 11 provides light to the light sensing member 300, which is not in a main emission direction of light. If a light emission direction of the light emitting device 12a is double-sided or is a rear direction, the bottom device unit 11 may include a reflective member.

According to an embodiment, the bottom device unit 11 includes wirings for driving the light emitting device 12a, an electrode, an insulating layer, etc.

Since the top device unit 13 is disposed in a primary emission direction of light Li, the top device unit 13 includes a region, such as a display region, capable of at least partially transmitting light. The top device unit 13 may include a color filer to implement specific colors, but embodiments are not limited thereto. In addition, according to an embodiment, the top device unit 13 includes a light modulating member, such as a prism film, a diffusion film, a micro-lens film etc., that modifies light characteristics of light L1 emitted from the top device unit 13.

According to an embodiment, at least one light sensing member 300 is disposed at the rear of the bottom device unit 11. The light sensing member 300 directly receives leaked light L2 that has propagated from the light emitting device unit 12 through the bottom device unit 11, and acquires a light-emitting luminance value from the light. The light sensing member 300 overlaps a region of the top device unit 13 that transmits light L1.

Hereinafter, a more detailed description will be presented with reference to an organic light-emitting diode display device as the top emission device.

Figure 2:
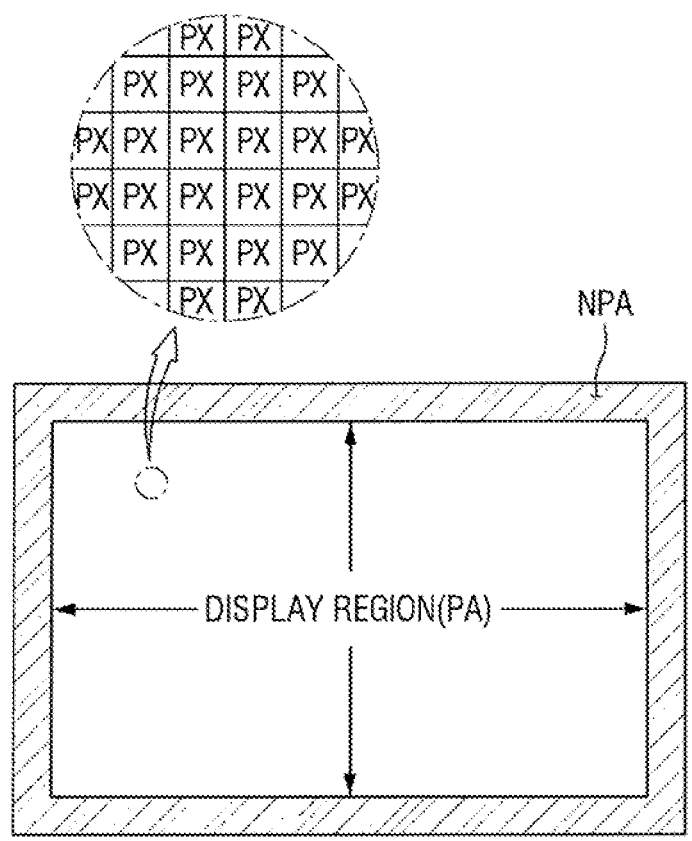
FIG. 2 is a plan view of an organic light-emitting diode display device according to an exemplary embodiment of the present disclosure.

FIG. 2 is a plan view of an organic light-emitting diode display device according to an exemplary embodiment of the present disclosure.

Referring to FIG. 2, an organic light-emitting diode display device 500 can be divided into a display region PA and a non-display region NPA that surrounds the display region PA.

According to an embodiment, the display region PA includes a plurality of pixels PX. The respective pixels PX are arranged in a matrix form. The respective pixels PX are allocated to display specific colors. For example, the plurality of pixels PX may include an R pixel displaying red, a G pixel displaying green, and a B pixel displaying blue. The R pixel, G pixel, and B pixel are alternately arranged to display various colors.

The display region PA may have a rectangular shape, but is not limited thereto. The display region PA may have a square shape, a circular shape, an oval shape, etc.

According to an embodiment, the non-display region NPA is positioned in the periphery of the display region PA. The non-display region NPA does not display an image, and a light-shielding member such as a black matrix is disposed therein. The non-display region NPA forms a bezel portion of the organic light-emitting diode display device 500. Various driving devices that drive the pixels PX can be disposed in the non-display region NPA. Pixels PX may also be disposed within the non-display region NPA, but in this case, those pixels PX disposed within the non-display region NPA are dummy pixels that not externally visible.

Figure 3:
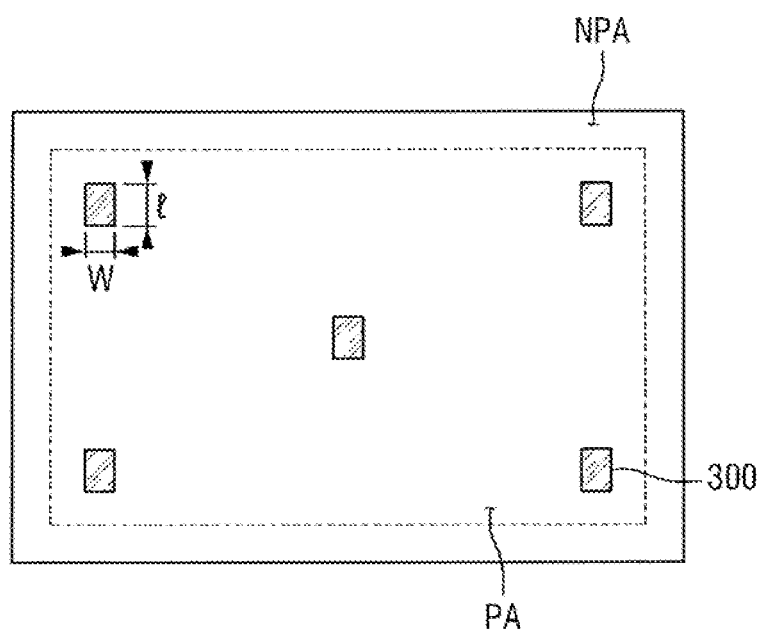
FIG. 3 is a rear view of an organic light-emitting diode display device according to an exemplary embodiment of the present disclosure.

FIG. 3 is a rear view of a organic light-emitting diode display device according to an exemplary embodiment of the present disclosure.

Referring to FIG. 3, at least one light sensing member 300 is disposed behind the organic light-emitting diode display device 500. When a plurality of light sensing members 300 are disposed, the respective light sensing members 300 are spaced apart from each other. Alternatively, two or more light sensing members 300 may be adjacent to each other to form a single light sensing member group, and a plurality of light sensing member groups are spaced apart from each other. According to an embodiment, the light sensing members 300 are disposed in a region that overlaps the display region PA.

According to an embodiment, each light sensing member 300 overlaps a plurality of pixels PX. For example, the light sensing member 300 extend in one direction and may overlap two or more pixels PX in a length (l) direction. The light sensing member 300 may overlap one pixel PX or two or more pixels PX in a width (w) direction. When the light sensing member 300 overlaps two or more pixels PX in the width (w) direction, the number of pixels PX overlapped therein may be less than the number of pixels PX overlapped in the length (l) direction. FIG. 3 illustrates a case in which the length (l) direction of the light sensing member 300 corresponds to a column direction of the pixels PX. However, alternatively, the length (l) direction of the light sensing member 300 may correspond to a row direction of the pixels PX. In addition, the length (l) direction of the light sensing member 300 may be a direction diagonal to the column direction of the pixels PX and the row direction of the pixels PX.

According to an embodiment, the respective light sensing members 300 are uniformly, widely spread over the display region PA. For example, as illustrated in FIG. 3, the light sensing members 300 are disposed in the vicinity of four corners, namely, a left-top portion, a right-top portion, a left-bottom portion and a right-bottom portion, and a central portion of the display region PA.

According to an embodiment, the light sensing members 300 disposed in the left-top portion and the right-bottom portion are symmetric with respect to each other with respect to the light sensing member 300 disposed in the central portion of the display region PA. The light sensing members 300 disposed in the right-top portion and the left-bottom portion are symmetric with respect to each other the light sensing member 300 disposed in the central portion of the display region PA. In this manner, when the light sensing members 300 are uniformly spread over the entirety of the display region PA, a luminance value of the overall display region PA can be easily estimated using luminance information acquired by the light sensing members 300.

Alternatively, the light sensing members 300 may be selectively disposed in pixel PX regions having a high possibility of degradation and can be used to determine a degree of degradation in the corresponding pixel PX region. A more detailed description will be made with reference to FIG. 4 and FIG. 5.

Figure 4:
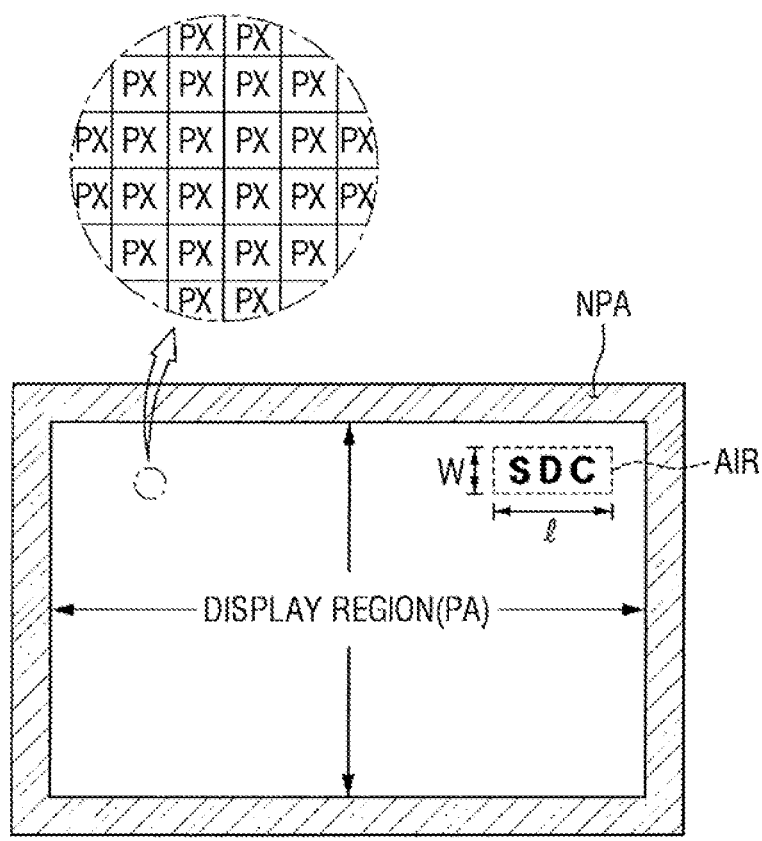
FIG. 4 is a plan view of an organic light-emitting diode display device according to another exemplary embodiment of the present disclosure.

FIG. 4 is a plan view of an organic light-emitting diode display device according to another exemplary embodiment of the present disclosure.

Figure 5:
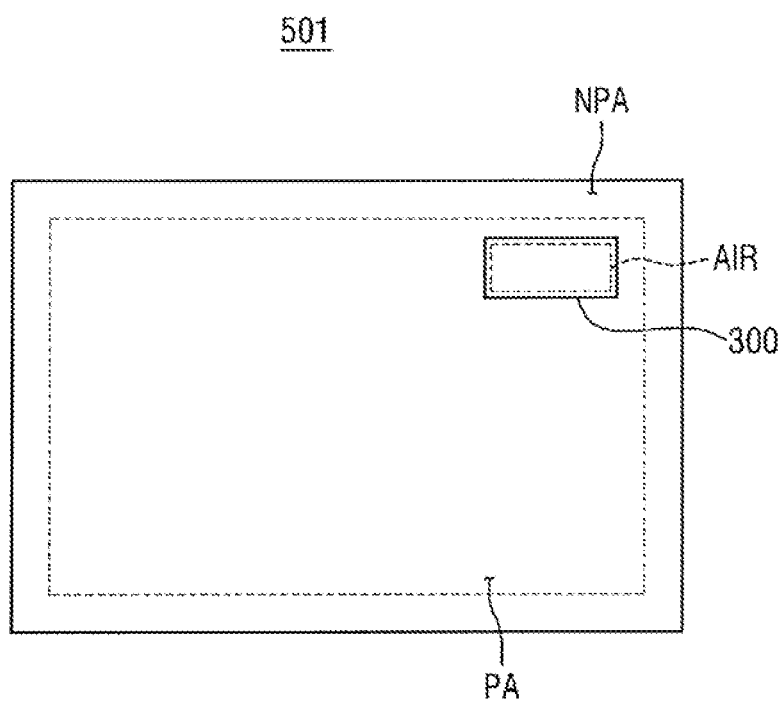
FIG. 5 is a rear view of an organic light-emitting diode display device according to another exemplary embodiment of the present disclosure.

FIG. 5 is a rear view of an organic light-emitting diode display device according to another exemplary embodiment of the present disclosure. In the exemplary embodiment of FIG. 4 and FIG. 5, the same components as those of the foregoing exemplary embodiment of FIG. 2 and FIG. 3 are referred to using the same reference numerals and a repeated explanation is omitted or simplified.

Referring to FIG. 4 and FIG. 5, an organic light-emitting diode display device 501 according to an exemplary embodiment includes a display region PA and a non-display region NPA surrounding the display region PA. The display region PA of the organic light-emitting diode display device 501 according to an exemplary embodiment includes a central portion and a circumferential portion surrounding the central portion. A width of the central portion in one direction may be equal to or greater than a width of the circumferential portion adjacent to the central portion in a width direction. If the display region PA is divided into three equal parts, such as one circumferential portion, a central portion, and another circumferential portion, in a direction parallel to one side of the display region PA, the widths of the central portion and the circumferential portion are identical to each other.

According to an embodiment, the circumferential portion of the display region PA includes a degradation-expected region, for example, an afterimage-expected region AIR. The afterimage-expected region AIR is a region having a high probability of deterioration, such as an occurrence of an afterimage.

For example, a video image received from broadcasting system may include a broadcaster logo positioned in a right top portion of a screen. An exemplary broadcaster logo "SDC" is displayed in the AIR of FIG. 4. The broadcaster logo maintains an identical image in a corresponding position even as the video image changes. Thus, as the pixels PX in the corresponding position display an identical luminance and color for an identical image over a long period of time, the possibility that the pixels PX degrade is high, and an afterimage phenomenon can occur. A position in which an actual afterimage occurs may vary according to a displayed image. A region having a high probability that an afterimage frequently occurs may be set as the afterimage-expected region AIR.

In an exemplary embodiment, the afterimage-expected region AIR is disposed at an edge of the circumferential portion of the display region PA. For example, the afterimage-expected region AIR may be set in the right top portion of the display region PA. Alternatively, the afterimage-expected region AIR may also be set in the left top portion, the left bottom portion, and/or the right bottom portion of the display region PA.

The afterimage-expected region AIR may be provided in plural, and in this case, the plurality of respective afterimage-expected regions may be spaced apart from each other.

According to an embodiment, the afterimage-expected region AIR includes a plurality of pixels PX. For example, the afterimage-expected region AIR extends in one direction and includes two or more pixels PX in the length (l) direction. The afterimage-expected region AIR may include one pixel PX or two or more pixels PX in the width (w) direction. When the afterimage-expected region AIR includes two or more pixels PX in the width (w) direction, the number of pixels PX included in the width (w) direction may be less than the number of pixels PX included in the length (l) direction. FIG. 4 and FIG. 5 illustrate a case in which the length (l) direction of the afterimage-expected region AIR corresponds to a column direction of the pixels PX. However, alternatively, the length (l) direction of the afterimage-expected region AIR may correspond to a row direction of the pixels PX. In addition, the length (l) direction of the afterimage-expected region AIR may be a direction diagonal to the column direction of the pixels PX and the row direction of the pixels PX.

According to an embodiment, the light sensing member 300 overlaps the display region PA. The light sensing member 300 is disposed in the circumferential portion of the display region PA. Further, the light sensing member 300 may at least partially overlap the afterimage-expected region AIR. When the afterimage-expected region AIR is provided in plural, the light sensing member 300 is also be provided in plural, and the plurality of light sensing members 300 may be at least partially overlap the respective afterimage-expected regions AIR. The light sensing member 300 may have a shape similar to that of the afterimage-expected region AIR, for example, a shape that extends in one direction.

According to an embodiment, the light sensing member 300 that overlaps the afterimage-expected region AIR can directly receive leakage light from the afterimage-expected region AIR. Luminance information determined in this manner may be used to determine a degree of degradation in a corresponding region.

In detail, when light is emitted by applying a data signal to the afterimage-expected region AIR, light leaking from the afterimage-expected region AIR is received by the light sensing member 300. The light sensing member 300 provides corresponding luminance information to a controller. The controller can estimate the luminance actually emitted from a corresponding region, using luminance information received from the light sensing member 300. One method of estimating an actual emitted luminance value involves reading an estimated luminance value from a look-up table stored in a memory. However, embodiments of the present disclosure are not limited thereto, and an actual luminance value may be estimated by various methods commonly known in the art. In addition, whether or not degradation occurs may be confirmed using only the provided luminance information, without estimating the actual luminance value.

According to an embodiment, the luminance value provided to the controller, or the estimated luminance value, is compared with the input data signal, and whether the luminance value is an appropriate luminance value can be determined. If the luminance value is less than the data signal, a compensation signal may be generated and if light is emitted from the afterimage-expected region AIR, a correction data signal formed by adding the compensation signal to the data signal is applied, such that luminance of the afterimage-expected region AIR may be compensated to an appropriate level.

According to an embodiment, the measurement of the luminance value and the generation of the compensation signal can be continuously performed while displaying an image on the organic light-emitting diode display device 500, and may also be periodically performed. In addition, if an image is received which is expected to induce an afterimage, the measurement of the luminance value and the generation of the compensation signal can be performed. Alternatively, the measurement of the luminance value and the generation of the compensation signal may be performed immediately after turning-on or turning-off the organic light-emitting diode display device 501.

Hereinafter, an organic light-emitting diode display device is illustrated in the embodiments of FIG. 2 and FIG. 3, but it may be obvious that the organic light-emitting diode display device may be substituted with the example of FIG. 4 and FIG. 5.

Figure 6:
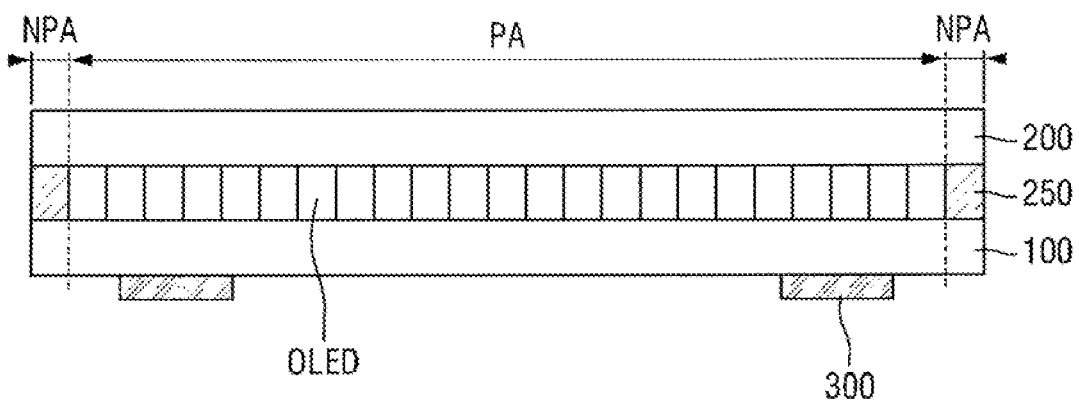
FIG. 6 is a schematic cross-sectional view of an organic light-emitting diode display device according to an exemplary embodiment of the present disclosure.

Referring to FIG. 6, a cross-sectional structure of the organic light-emitting diode display device 500 illustrated in FIG. 2 is described. FIG. 6 is a schematic cross-sectional view of an organic light-emitting diode display device according to an exemplary embodiment of the present disclosure.

Referring to FIG. 6, a first substrate 100 and a second substrate 200 are opposed to each other, and organic light-emitting devices OLED are disposed in the display region PA therebetween. The first substrate 100 may be a thin film transistor substrate, and the second substrate 200 may be a sealing substrate. The organic light-emitting devices OLED are divided and disposed in respective pixels. A sealing material 250 is interposed between the first substrate 100 and the second substrate 200 in the non-display region NPA. The sealing material 250 can couple the first substrate 100 and the second substrate 200 while protecting the internal organic light-emitting devices OLED. The light sensing member 300 can be attached to a rear surface of the first substrate 100.

Alternatively, unlike the exemplary embodiment illustrated in FIG. 6, a sealing layer formed of an insulating material can be used, instead of the second substrate 200. In this case, the sealing material 250 can be omitted and the sealing layer can be formed directly on the first substrate 100 and coupled thereto.

Hereinafter, a pixel structure of the organic light-emitting diode display device 500 will be explained in more detail.

Figure 7:
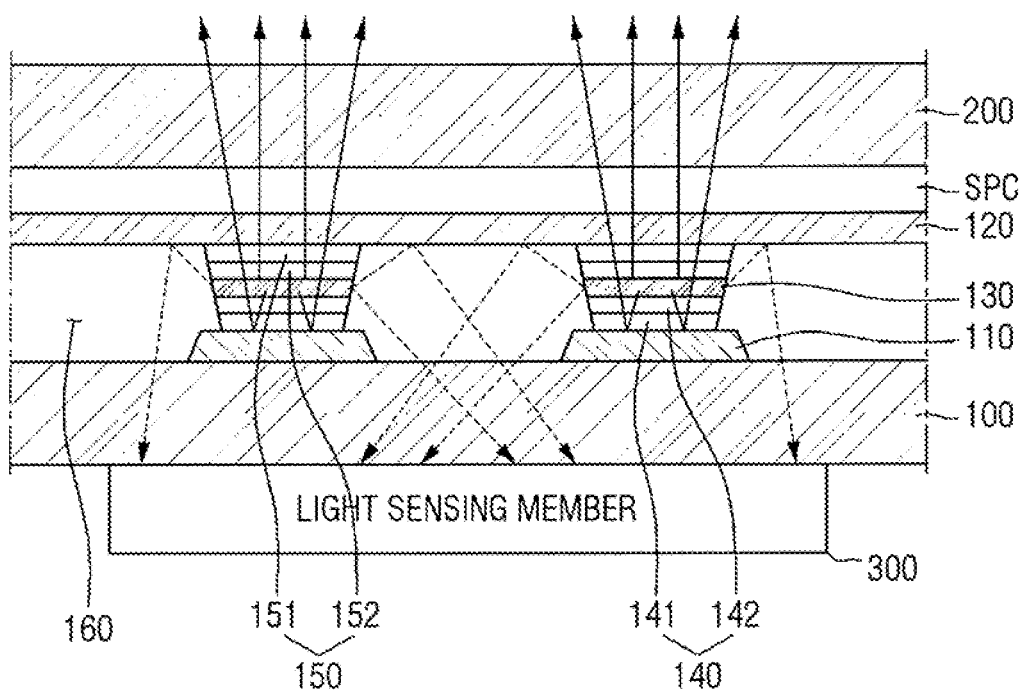
FIG. 7 is a cross-sectional view of a pixel structure of an organic light-emitting diode display device according to an exemplary embodiment of the present disclosure.

FIG. 7 is a cross-sectional view of a pixel structure of an organic light-emitting diode display device according to an exemplary embodiment of the present disclosure.

Referring to FIG. 7, the organic light-emitting diode display device 500 includes the first substrate 100, an organic light-emitting device disposed on the first substrate 100, and the second substrate 200 disposed above the organic light-emitting device. The organic light-emitting device includes a first electrode 110, a second electrode 120 opposed to the first electrode 110, and an organic light-emitting layer 130 interposed between the first electrode 110 and the second electrode 120. A first charge transfer region 140 is disposed between the first electrode 110 and the organic light-emitting layer 130. In addition, a second charge transfer region 150 is disposed between the organic light-emitting layer 130 and the second electrode 120.

One of the opposing first and second electrodes 110 and with the organic light-emitting layer 130 interposed therebetween may be an anode electrode and the other thereof may be a cathode electrode. In addition, one of the first and second charge transfer regions 140 and 150 may transfer holes, and the other thereof may transfer electrons.

The exemplary embodiment of FIG. 7 illustrates a case in which the first electrode 110 is an anode electrode and the second electrode 120 is a cathode electrode. Accordingly, the first charge transfer region 140 adjacent to the anode electrode is a hole transfer region and the second charge transfer region 150 adjacent to the cathode electrode is an electron transfer region.

According to an embodiment, the first substrate 100 includes an insulating substrate. The insulating substrate may be formed of a material such as glass, quartz, polymer resin, etc. Examples of a polymer resin include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT or TAC), cellulose acetate propionate (CAP), or combinations thereof. In some exemplary embodiments, the insulating substrate is a flexible substrate formed of a flexible material such as polyimide (PI).

In addition, according to embodiments, the first substrate 100 includes other structures disposed on the insulating substrate. Examples of the other structures include wirings for driving the organic light-emitting device, an electrode, an insulating layer, etc. In some exemplary embodiments, the first substrate 100 includes a plurality of thin film transistors disposed on the insulating substrate. A drain electrode of the plurality of thin film transistors is electrically connected to the first electrode 110. The thin film transistors include active regions formed of amorphous silicon, polycrystalline silicon, mono-crystalline silicon, etc. In another exemplary embodiment, the thin film transistors include active regions formed of an oxide semiconductor.

According to an embodiment, the first electrode 110 is disposed on the first substrate 100. The first electrode 110 is disposed in each pixel of the organic light-emitting diode display device 500. The first electrode 110 contains a conductive material having a relatively high work function as compared to the second electrode 120. For example, the first electrode 110 may include Indium-Tin-Oxide (ITO), Indium-Zinc-Oxide (IZO), Zinc Oxide (ZnO), Induim Oxide ($In_2O_3$), etc. The first electrode 110 may further contain a reflective material, such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or combinations thereof, in addition to the conductive material. Thus, the first electrode 110 may have a single layer structure formed of the conductive material and the reflective material or a multilayer structure having them stacked therein. In the case of a multilayer structure, a top layer adjacent to the first charge transfer region 140 can be formed of a conductive material having a high work function. For example, the first electrode 110 may have a multilayer structure of ITO/Mg, ITO/MgF, ITO/Ag, or ITO/Ag/ITO, but is not limited thereto.

According to an embodiment, a pixel defining layer 160 is disposed on the first substrate 100. The pixel defining layer 160 is arranged in a lattice form along boundaries of pixels and physically divides the respective pixels. The pixel defining layer 160 may at least partially expose the first electrode 110. For example, the pixel defining layer 160 can be disposed to overlap an edge portion of the first electrode 110. The pixel defining layer 160 defines pixel partitions, and the organic light-emitting layer 130 is disposed within each space defined by the pixel defining layer 160. In addition, a spacer may be disposed on the pixel defining layer 160. In this case, an end of the spacer may be adjacent to or may contact the second substrate 200.

According to an embodiment, the first charge transfer region 140 is disposed on the first electrode 110. The first charge transfer region 140 may have a single layer structure formed of a single material, may be formed of a plurality of different materials, or may have a multilayer structure including a plurality of layers formed of a plurality of different materials. In addition, the first charge transfer region 140 may further include a buffer layer and a first charge blocking layer. Although FIG. 7 illustrates a case in which the first charge transfer region 140 includes a first charge injection layer 141 and a first charge transport layer 142, one of the first charge injection layer 141 and the first charge transport layer 142 can be omitted or the layers can be configured as a single layer.

According to an embodiment, the first charge injection layer 141 is disposed on the first electrode 110 and increases efficiency of injecting holes into the organic light-emitting layer 130 from the first electrode 110. Specifically, the first charge injection layer 141 lowers an energy barrier to allow for more effective injection of the holes.

According to an embodiment, the first charge injection layer 141 contains a phthalocyanine compound such as copper phthalocyanine (CuPc), m-MTDATA(4,4',4"-tris(N-3-methylphenyl-N-phenylamino)triphenylamine), TDATA (4,4',4"-tris(diphenylamino)triphenylamine), 2-TNATA(4, 4',4"-tris[2-naphthyl(phenyl)-amino]triphenyl-amine), Pani/DBSA (Polyaniline/Dodecylbenzenesulfonic acid), PEDOT/PSS(Poly(3,4-ethylene dioxythiophene)/Polystyrene sulfonate), PANI/CSA (Polyaniline/Camphorsulfonic acid), or PANI/PSS (Polyaniline/Polystyrene sulfonate).

According to an embodiment, the first charge transport layer 142 is disposed on the first charge injection layer 141 and transports the holes injected into the first charge injection layer 141 to the organic light-emitting layer 130. When the energy level of the highest occupied molecular orbital (HOMO) of the first charge transport layer 142 is substantially lower than a work function of a material of the first electrode 110 and is substantially higher than the highest occupied molecular orbital (HOMO) of the organic light-emitting layer 130, hole-transporting efficiency may be optimized. The first charge transport layer 142 may contain, for example, NPD(4,4'-bis[N-(1-napthyl)-N-phenylamino] biphenyl), TPD(N,N'-diphenyl-N,N'-bis[3-methylphenyl]-1, 1'-biphenyl-4,4'-diamine), s-TAD(2,2',7,7'-tetrakis-(N,N-diphenylamino)-9,9'-spirobifluoren), m-MTDATA(4,4',4"-tris (N-3-methylphenyl-N-phenylamino)triphenylamine), etc., but is not limited thereto.

According to an embodiment, the first charge transfer region 140 also includes charge generating materials to improve conductivity, in addition to the materials previously mentioned above. The charge generating materials may be uniformly or non-uniformly dispersed within the first charge transfer region 140. The charge-generating material may be, for example, a p-dopant. The p-dopant may be one of a quinone derivative, a metal oxide, or a compound with a cyano group, but is not limited thereto.

Non-limiting examples of the p-dopant include quinone derivatives such as tetracyanoquinodimethane (TCNQ) and 2,3,5,6-tetrafluoro-tetracyano-1,4-benzoquinodimethane (F4-TCNQ); metal oxides such as a tungsten oxide and a molybdenum oxide; etc.

In addition, according to an embodiment, the first charge transfer region 140 includes at least one of a buffer layer and a first charge blocking layer. The buffer layer compensates for a resonance distance of light as a function of a wavelength of the light emitted from the organic light-emitting layer 130, and thus can increase light emission efficiency. The buffer layer may include the same material as that included in the first charge transfer region 140. The first charge blocking layer can prevent charges from being injected into the first charge transfer region 140 from the second charge transfer region 150.

According to an embodiment, the organic light-emitting layer 130 is disposed on the first charge transfer region 140. A material of the organic light-emitting layer 130 is not particularly limited as long as it is a light emitting material, and may be formed of, for example, a material that emits red light, green light and blue light. The organic light-emitting layer 130 may contain a fluorescent or phosphorescent substance.

In an exemplary embodiment, the organic light-emitting layer 130 includes a host and a dopant.

Examples of the host include Alq3(tris-(8-hydroxyquinolato)aluminum(III)), CBP(4,4'-N,N'-dicarbazole-biphenyl), PVK(poly(N-vinylcarbazole)), ADN(9,10-Bis(2-naphthalenyl)anthracene), TCTA(4,4',4"-tris(Ncarbazolyl)triphenylamine), TPBi(1,3,5-tris(N-phenylbenzimiazole-2-yl) benzene), TBADN(2-(t-butyl)-9,10-bis(20-naphthyl) anthracene), DSA(distyrylarylene), CDBP(4,4'-Bis(9-carbazolyl)-2,2'-Dimethyl-biphenyl), MADN(2-Methyl-9,10-bis (naphthalen-2-yl)anthracene), etc.

As the dopant, both a fluorescent dopant and a phosphorescent dopant commonly known in the art can be used. A type of the dopant can vary depending on a light-emitting color of the organic light-emitting layer 130.

A red dopant may be a fluorescent substance, including, for example, PBD (Eu(DBM)3(Phen)(2-biphenyl-4-yl-5-(4-t-butylphenyl)-1,3,4 oxadiazole (Tris(dibenzoylmethane) mono(1,10-phenanthroline)europium(III)) or perylene.

Alternatively, the red dopant may be selected from phosphorescent substances including metal complexes such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum) or an organometallic complex.

A green dopant may be a fluorescent substance including, for example, Alq3(tris-(8-hydroyquinolato)aluminum(III)). Alternatively, the green dopant may be a phosphorescent substance, such as Ir(ppy)3(fac tris(2-phenylpyridine) iridium), Ir(ppy)2(acac)(Bis(2-phenylpyridine)(acetylacetonate)iridium(III)), Ir(mpyp)3(2-phenyl-4-methyl-pyridine iridium), etc.

A blue dopant may be a fluorescent substance, including spiro-DPVBi(spiro-4,'-bis(2,2'-diphenylvinyl) 1,1'-biphenyl), spiro-6P(spiro-sixphenyl), DSB(distyrylbenzene), DSA(distyrylarylene), a PFO(polyfluorene)-based polymer and a PPV(poly p-phenylene vinylene))-based polymer. Alternatively, the blue dopant may be a phosphorescent substance, such as F2Irpic(bis[2-(4,6-difluorophenyl)pyridinato-N,C2']iridium picolinate), (F2ppy)2Ir(tmd)(bis[2-(4,6-difluorophenyl)pyridinato-N,C2']iridium 2,2,6,6-tetramethylheptane-3,5-dione), Ir(dfppz)3(tris[1-(4,6-difluorophenyl)pyrazolate-N,C2']iridium), etc.

According to an embodiment, the second charge transfer region 150 is disposed on the organic light-emitting layer 130. The second charge transfer region 150 may have a single layer structure formed of a single material or formed of a plurality of different materials, or may have a multilayer structure that includes a plurality of layers formed of a plurality of different materials. In addition, the second charge transfer region 150 may further include a second charge blocking layer. Although FIG. 7 illustrates a case in which the second charge transfer region 150 includes a second charge injection layer 151 and a second charge transport layer 152, one of the second charge injection layer 151 and the second charge transport layer 152 can be omitted or the layers can be configured as a single layer.

According to an embodiment, the second charge transport layer 152 is disposed on the organic light-emitting layer 130 and transports the holes injected from the second charge injection layer 151 into the organic light-emitting layer 130.

The second charge transport layer 152 may include Alq3 (tris-(8-hydroyquinolato)aluminum(II)), TPBi(1,3,5-tris(N-phenylbenzimiazole-2-yl)benzene), BCP(2,9-dimethyl-4,7-diphenyl-1,10-phenanthroline), Bphen(4,7-diphenyl-1,10-phenanthroline), TAZ(3-(Biphenyl-4-yl)-5-(4-tert-butylphenyl)-4-phenyl-4H-1,2,4-triazole), NTAZ(4-(naphthalen-1-yl)-3,5-diphenyl-4H-1,2,4-triazole), tBu-PBD(2-(4-biphenylyl)-5-(4-tert-butyl-phenyl)-1,3,4-oxadiazole), BAlq(Bis(2-methyl-8-quinolinolato-N1,O8)-(1,1'-Biphenyl-4-olato)aluminum), Bebq2(Bis(10-hydroxybenzo[h]quinolinato)beryllium), ADN(9,10-bis(2-naphthyl)anthracene), and combinations thereof, but is not limited thereto.

According to an embodiment, the second charge injection layer 151 is disposed on the second charge transport layer 152 and can increase efficiency of injecting electrons into the organic light-emitting layer 130 from the second electrode 120.

The second charge injection layer 151 may be a lanthanum metal such as LiF, LiQ (lithium quinolate), Li2O, BaO, NaCl, CsF or Yb, a metal halide such as RbCl or RbI, etc., but is not limited thereto. The second charge injection layer 151 may also be formed of a mixture of said materials and insulating organo-metal salts. The organo-metal salts should have an energy band gap of approximately 4 eV or greater. Specifically, the organo-metal salts may contain, for example, a metal acetate, a metal benzoate, a metal acetoacetate, a metal acetylacetonate, or a metal stearate.

In addition, according to an embodiment, the second charge transfer region 150 includes a second charge blocking layer. The second charge blocking layer may contain, for example, at least one of BCP(2,9-dimethyl-4,7-diphenyl-1,10-phenanthroline) and Bphen(4,7-diphenyl-1,10-phenanthroline), but is not limited thereto.

According to an embodiment, the second electrode 120 is disposed on the second charge transfer region 150. The second electrode 120 is a top electrode or common electrode formed in a manner so that pixels are not divided. The second electrode 120 contains a conductive material having a relatively low work function as compared to the first electrode 110.

For example, the second electrode 120 may contain Li, Ca, LiF/Ca, LiF/Al, Al, Mg, Ag, Pt, Pd, Ni, Au Nd, Ir, Cr, BaF, Ba or compounds or mixtures thereof, such as a mixture of Ag and Mg, etc. According to an embodiment, the second electrode 120 is provided as a thin film and on the second electrode 120, a transparent metal oxide, such as Indium-Tin-Oxide (ITO), (Indium-Zinc-Oxide (IZO), (Zinc Oxide (ZnO), (Indium-Tin-Zinc-Oxide), etc, is stacked.

According to an embodiment, the second substrate 200 is disposed on the second electrode 120. The second substrate 200 includes an insulating substrate. The second substrate 200 can be formed of the same materials as the first substrate 100. In some exemplary embodiments, a black matrix, a color filer etc., is disposed on the second substrate 200.

According to an embodiment, the organic light-emitting devices formed on the first substrate 100 and the second substrate 200 are spaced apart from each other. A space SPC interposed between the second substrate 200 and the second electrode 120 may be vacant or may be filled with a filler formed of an organic material, etc.

When a first voltage is applied to the first electrode 110 and a second voltage lower than the first voltage is applied to the second electrode 120, a current flows in a direction from the first electrode 110 to the second electrode 120, whereby the organic light-emitting layer 130 emits light. Specifically, holes are injected into the first charge injection layer 141 from the first electrode 110 and are transported via the first charge transport layer 142 to the organic light-emitting layer 130. In addition, electrons are injected into the second charge injection layer 151 from the second electrode 120 and are transported via the second charge transport layer 152 to the organic light-emitting layer 130. When holes and electrons meet to combine with each other in the organic light-emitting layer 130, the light emitting material of the organic light-emitting layer 130 is excited by the energy generated from the combination. Light is emitted when the light emitting material returns from the excited state to a ground state. The amount of emitted light may vary according to the amount of current flowing through the organic light-emitting layer 130.

In addition, the propagation directions of light emitted from the organic light-emitting layer 130 are randomly distributed. Basically, light can be emitted toward the rear toward the first substrate 100, emitted toward the front toward the second substrate 200, emitted laterally, etc.

Light directed toward the rear, which is a bottom emission type, can be reflected from the first electrode 110 and propagate toward the front. In some cases, a portion of light may penetrate through the first electrode 110 and may enter the first substrate 100.

Light directed toward the front, which is a top emission type, can penetrate through the second electrode 120. The conductive material of the second electrode 120 has a low work function, and may not itself transmit light, but if the conductive material is a thin film, sufficient incident light can penetrate through the conductive material. A portion of light that does not penetrate through the second electrode 120 is reflected.

Another portion of light propagates laterally through the pixel defining layer 160. Another portion of light is reflected from the pixel defining layer 160 to be directed toward the front and can penetrate through the second electrode 120, as described above. Another portion of light is reflected from the pixel defining layer 160 to be directed toward the rear, and another portion of light is refracted into the pixel defining layer.

A portion of light reflected in a rear direction from the pixel defining layer 160 or light entering the interior of the pixel defining layer 160 may be emitted to the first substrate 100 through a lower portion of the pixel defining layer 160 on which no first electrodes 110 are formed. Light emitted to the first substrate 100 in this manner is leakage light that does not contribute to displaying an image. Such leakage light can enter the light sensing member 300 disposed on the rear surface of the first substrate 100 and can be used to determine a degree of light emission luminance or pixel degradation.

In addition, there can be other portions of light reflected in a rear direction from the pixel defining layer 160 or light entering the interior of the pixel defining layer 160 that continuously propagate along a lateral surface of the organic light-emitting diode display device 500. Such light can be reflected from top and bottom electrodes, wirings, etc., and may laterally propagate a considerable distance. However, for the top emission type organic light-emitting diode display device 500, the propagation distance thereof along the lateral surface may be less as compared to a bottom emission type device. For a bottom emission type, since a reflective electrode may be disposed in the front of the device, and since other wirings may be disposed in the rear direction even if the first electrode is a transparent electrode, a lateral propagation distance due to reflection may be considerable. On the other hand, for a top emission type, since the second electrode 120 positioned in the front is a transparent electrode, the amount of reflected light is reduced, and consequently, the amount of light transmitted through the lateral surface is reduced. Thus, for a bottom emission type, a considerable amount of light is transmitted to the non-display region of the organic light-emitting diode display device, while for a top emission type, the amount of light transmitted to the non-display region of the organic light-emitting diode display device is insignificant. Due to this difference, an appropriate disposition of the light sensing members 300 differs between a top emission device and a bottom emission device. As in an exemplary embodiment, when the light sensing member 300 is disposed within the display region, since the light sensing member 300 can directly receive leakage light, effective light sensing is enabled even in the top emission device, without loss of leakage light.

Hereinafter, a light sensing member is described in more detail.

Figure 8:
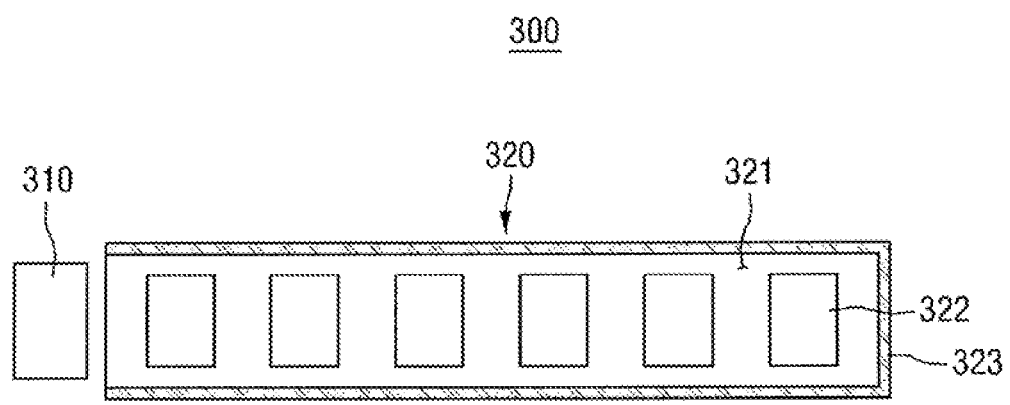
FIG. 8 is a plan view of a light sensing member of an organic light-emitting diode display device according to an exemplary embodiment of the present disclosure.
Figure 9:
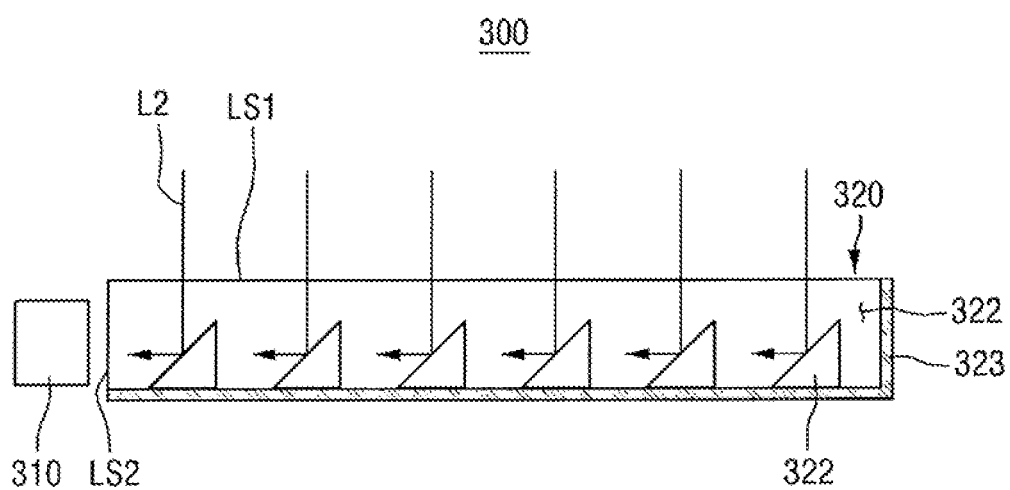
FIG. 9 is a cross-sectional view of a light sensing member of an organic light-emitting diode display device according to an exemplary embodiment of the present disclosure.

FIG. 8 is a plan view of a light sensing member of an organic light-emitting diode display device according to an exemplary embodiment of the present disclosure. FIG. 9 is a cross-sectional view of a light sensing member of an organic light-emitting diode display device according to an exemplary embodiment of the present disclosure.

Referring to FIG. 8 and FIG. 9, the light sensing member 300 includes a light sensor 310 and a light collecting member 320.

According to an embodiment, the light sensor 310 is disposed at one side of the light collecting member 320. The light sensor 310 receives leakage light L2 collected by the light collecting member 320 and measures luminance of the light. The light sensor 310 may include a photodiode, a phototransistor, etc., but is not limited thereto. Various devices commonly known in the art may be used as a sensor to detect light.

According to an embodiment, the light collecting member 320 includes a light collecting body 321. The light collecting body 321 includes a light input surface LS1 and a light output surface LS2. The light input surface LS1 and the light output surface LS2 are disposed at a predetermined angle, such as a right angle, with respect to each other. If the light collecting member 320 has a rectangular shape, the light input surface LS1 is a top surface of the light collecting body 321 and the light output surface LS2 is a side surface of the light collecting body 321.

According to an embodiment, the light collecting member 320 further includes a reflective member 323. The reflective member is disposed on a surface other than the light input surface LS1 and the light output surface LS2 of the light collecting body 321. The reflective member 323 may be coated as a reflective layer, may be attached in the form of a reflective sheet, or may be provided in the form of a reflective adhesive tape. The reflective member 323 may be omitted.

According to embodiments, the interior of the light collecting body 321 may be vacant or may be filled with other materials. For example, the interior of the light collecting body 321 may be a vacuum or may be filled with air or other gases.

According to an embodiment, a light-modulating structure 322 such as a refractive pattern or a reflective pattern is disposed in the light collecting body 321. For example, a prism pattern can be disposed in the light collecting body 321 as the light-modulating structure 322. A sloped surface of the prism pattern is inclined with respect to the light input surface LS1 of the light collecting body 321. An inclination angle may be, for example, 45°, but embodiments of the present disclosure are not limited thereto. The prism pattern may be formed of the same material as the light collecting body 321, or of a different material. The prism pattern may be formed of a transparent material.

According to an embodiment, the interior of the light collecting body 321, other than the light-modulating structure 322, has a refractive index different from that of the light collecting body 321 and the light-modulating structure 322. For example, the interior of the light collecting body 321, except for the light-modulating structure 322, can be a low refractive medium having a refractive index less than the light collecting body 321 itself and the light-modulating structure 322.

Since at least one surface of the light-modulating structure 322 contacts the low refractive medium, light transmission, reflection, or refraction occurs on the surface according to Snell's Law. When the sloped surface of the prism pattern of the light-modulating structure 322 is adjusted to totally reflect light vertically incident thereon, the leakage light L2 incident on the incident surface of the light collecting body 321 is totally reflected from the sloped surface of the prism pattern, such that a light propagation path changes to a direction substantially perpendicular with respect to the incident direction of the leakage light L2. Thus, light may be transmitted to the light sensor 310 on one side of the light collecting member 320.

According to an embodiment, the prism pattern of the light-modulating structure 322 is disposed along each column or row of the pixels corresponding thereto, in one-to-one correspondence. By disposing the prism pattern of the light-modulating structure 322 in this pattern, light leaking from the respective pixels may be transmitted to the light sensor 310.

In addition, according to an embodiment, light that is totally reflected from one light-modulating structure 322 can be incident onto an adjacent light-modulating structure 322. Thereafter, when the light propagation path changes due to Snell's Law, light may enter a bottom surface of the light collecting body 321, and if the reflective member 323 is disposed on the bottom surface of the light collecting body 321, light can be reflected from the reflective member 323 to the light sensor 310.

According a modified embodiment of the present disclosure, the interior of the light collecting body 321 is filled with the same material as that forming the light collecting body 321. In this case, the refractive index of the light-modulating structure 322 inside the light collecting body 321 may be adjusted to implement light collecting effects similar to those described above.

Figure 10:
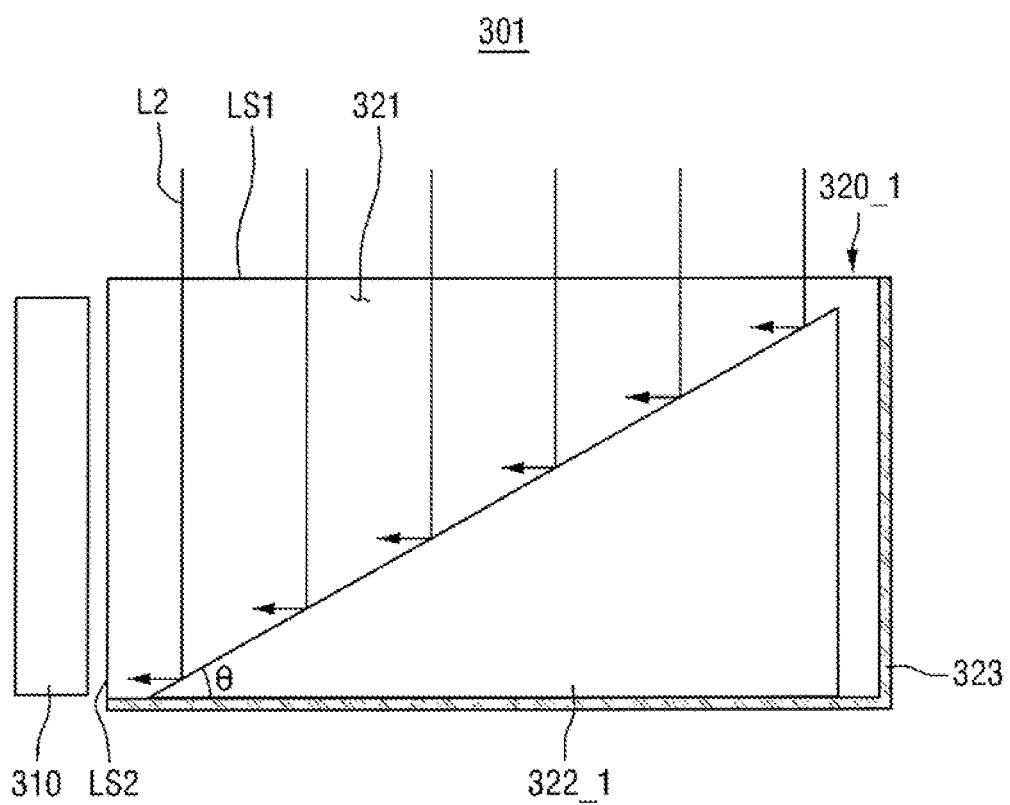
FIG. 10 is a cross-sectional view of a light sensing member of an organic light-emitting diode display device according to another exemplary embodiment of the present disclosure.

FIG. 10 is a cross-sectional view of a light sensing member of an organic light-emitting diode display device according to another exemplary embodiment of the present disclosure.

Referring to FIG. 10, a light sensing member 301 according to an exemplary embodiment differs from the embodiment of FIG. 9 in that a light-modulating structure 322_1 of a light collecting member 320_1 has a single continuous sloped surface, regardless of the pixel divisions. The sloped surface may reflect or totally reflect vertically incident light L2. An inclination angle (θ) may be an acute angle. Theoretically, when the inclination angle (θ) is 45°, a propagation direction of vertically incident leakage light L2 changes to a horizontal direction, such that light is transmitted to the light sensor 310. However, embodiments of the present disclosure are not limited thereto, and for other inclination angles (θ), the amount of light transmitted to the light sensor 310 can be increased by horizontally inclining the propagation direction of light L2. Moreover, even if reflected light L2 is re-directed toward the light input surface LS1 of the light collecting body 321, since an incident angle with respect to a normal of the light input surface LS1 has increased, the possibility of total reflection increases. Thus, leakage light L2 may be directed toward the light sensor 310.

In addition, according to an embodiment, when light reflected from a pixel disposed away from the light sensor 310 propagates to the light sensor 310, the light does not pass through the light-modulating structure again. Thus, unlike the embodiment of FIG. 9, it is unnecessary to form the light-modulating structure of a transparent material. Further, a reflective member may be disposed on the sloped surface.

Figure 11:
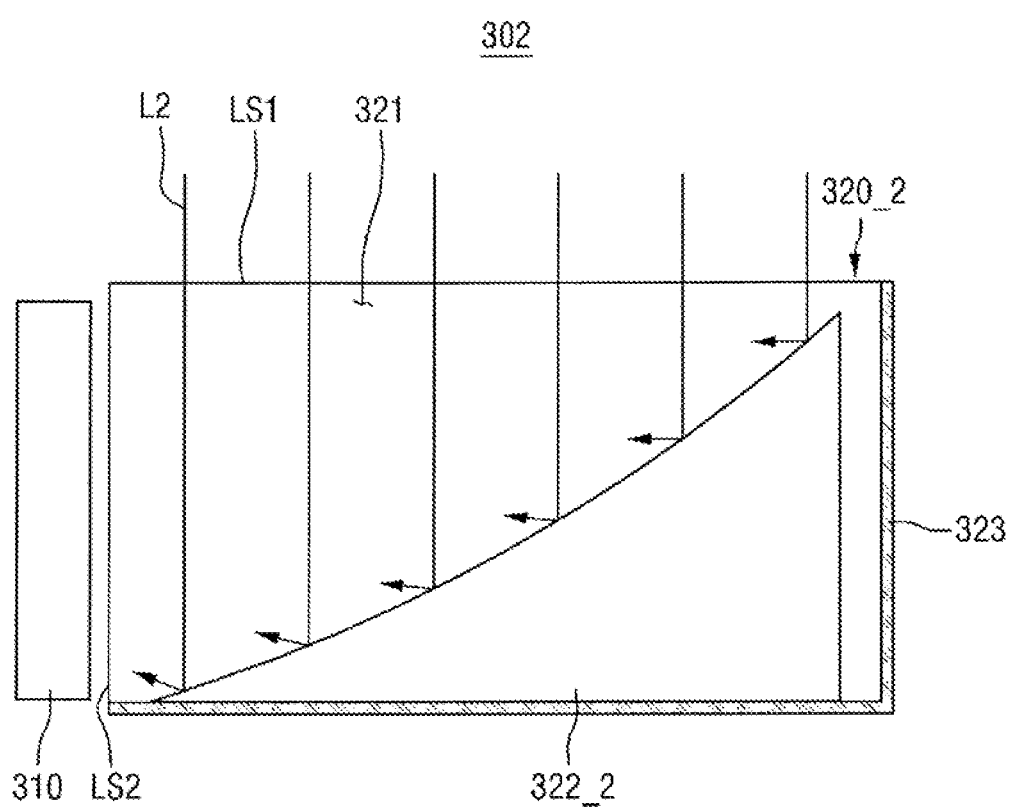
FIG. 11 is a cross-sectional view of a light sensing member of an organic light-emitting diode display device according to another exemplary embodiment of the present disclosure.

FIG. 11 is a cross-sectional view of a light sensing member of an organic light-emitting diode display device according to another exemplary embodiment of the present disclosure.

Referring to FIG. 11, a light sensing member 302 according to the exemplary embodiment is substantially identical to the embodiment of FIG. 10 in that a light-modulating structure 322_2 of a light collecting member 320_2 has a single, continuous sloped surface regardless of pixel divisions, but differs from the embodiment of FIG. 10 in that an inclination angle of the sloped surface decreases with decreasing distance to the light sensor 310. According to an embodiment, the sloped surface of the light-modulating structure 322_2 is a concave curved surface.

Figure 12:
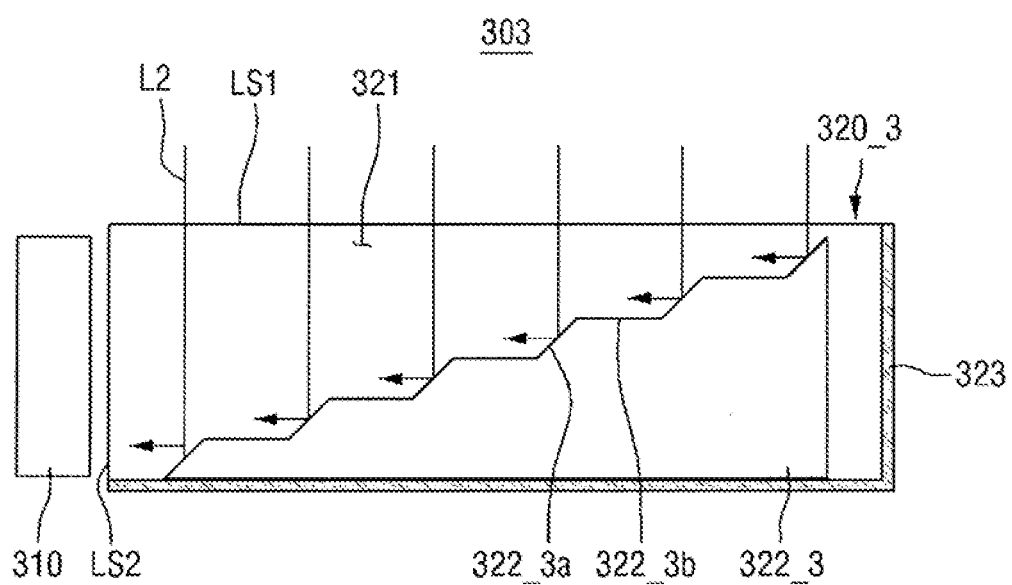
FIG. 12 is a cross-sectional view of a light sensing member of an organic light-emitting diode display device according to another exemplary embodiment of the present disclosure.

FIG. 12 is a cross-sectional view of a light sensing member of an organic light-emitting diode display device according to another exemplary embodiment of the present disclosure.

Referring to FIG. 12, a light sensing member 303 according to an exemplary embodiment is substantially identical to the embodiment of FIG. 10 in that a light-modulating structure 322_3 of a light collecting member 320_3 has an single, continuous sloped surface, but differs from the embodiment of FIG. 10 in that the sloped surface includes alternately disposed first and second surfaces 322_3a and 322_3b with different inclination angles.

According to an embodiment, the inclination angle of the first surface 322_3a is optimized to change the propagation direction of vertically incident leakage light L2 to a horizontal direction. For example, the inclination angle of the first surface 322_3a is 45°.

The inclination angle of the second surface 322_3b can be set within a range that does not block light L2 propagating horizontally from the adjacent first surface 322_3a. For example, the inclination angle of the second surface 322_3b can be in a range of about 0° to about 10°. If the inclination angle of the second surface 322_3b is 0°, the second surface 322_3b is a horizontal surface in a strict sense.

According to an embodiment, a width of a repeating unit of the first surface 322_3a and the second surface 322_3b is identical to a pitch of the pixels corresponding to the repeating unit. The second surface 322_3b may overlap the first electrode 110 of the organic light-emitting device, and the first surface 322_3a may overlap the pixel defining layer 160. However, embodiments of the present disclosure are not limited thereto. The relative positions of second surface 322_3b and the first surface 3223a may be reversed, or may partially overlap the first electrode and the pixel defining layer, respectively.

The embodiment of FIG. 10 illustrates that light is effectively collected as the inclination angle of the sloped surface approaches 45°. However, as the inclination angle of the sloped surface approaches 45°, a thickness of the light-modulating structure approximates a length of the light-modulating structure. However, according to an embodiment of FIG. 12, if the first surface 322_3a has an inclination angle of or close to 45° and is disposed in a region that receives a considerable amount of leakage light L2, while the second surface 322_3b has an inclination angle of or close to 0° and is disposed in a region that does not receive leakage light L2, the light sensing member 303 can efficiently collect light, and the thickness of the light-modulating structure 322_3 can be reduced.

Figure 13:
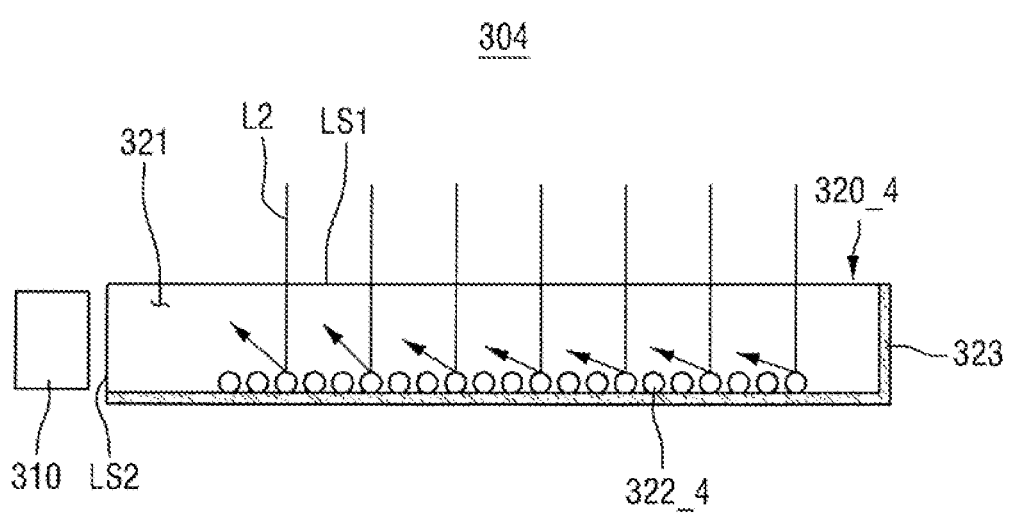
FIG. 13 is a cross-sectional view of a light sensing member of an organic light-emitting diode display device according to another exemplary embodiment of the present disclosure.

FIG. 13 is a cross-sectional view of a light sensing member of an organic light-emitting diode display device according to another exemplary embodiment of the present disclosure.

Referring to FIG. 13, a light sensing member 304 according to an exemplary embodiment differs from the embodiment of FIG. 9 in that there is a a light collecting member 320_4 with a light-modulating structure 322_4 that uses a light scattering member. The light scattering member scatters vertically incident light L2 to thereby change a light propagation path. The changed propagation path of light L2 may be directed directly to the light sensor 310, or may be reflected or totally reflected from the interior of the light collecting body 321 to thereby propagate to the light sensor 310.

According to an embodiment, the light scattering member includes light scattering particles. The light scattering particles may be organic beads or inorganic beads. The light scattering particles are formed of a material having a refractive index that differs from that of the interior portion of the light collecting body 321. The light scattering member is disposed adjacent to the rear of the light collecting body 321.

Figure 14:
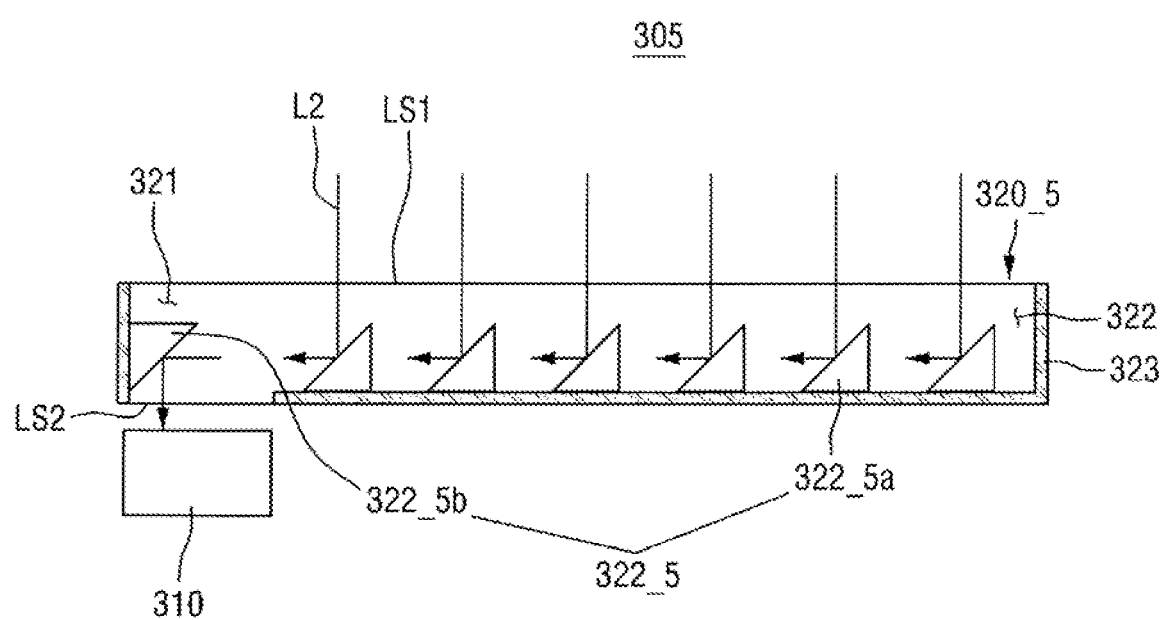
FIG. 14 is a cross-sectional view of a light sensing member of an organic light-emitting diode display device according to another exemplary embodiment of the present disclosure.

FIG. 14 is a cross-sectional view of a light sensing member of an organic light-emitting diode display device according to another exemplary embodiment of the present disclosure.

Referring to FIG. 14, a light sensing member 305 according to the exemplary embodiment differs from the embodiment of FIG. 9 in that the light sensor 310 is disposed at the rear of a light collecting member 320_5. That is, for example, the light collecting member 320_5 and the light sensor 310 are sequentially disposed on the rear surface of the first substrate 100. The light sensor 310 may be disposed on a rear surface adjacent to one side of the light collecting member 320_5.

According to an embodiment, there is a light-modulating structure 322_5 inside the light collecting body 321 that includes a first light path changing structure 322_5a, such as the prism pattern of FIG. 9, that changes a light path to a horizontal direction, as well as a second light path changing structure 322_5b that changes a light path to a vertical direction. The first light path changing structure 322_5a reflects leakage light L2 toward one side of the light collecting body 321, as in the embodiment of FIG. 9. The second light path changing structure 322_5b is disposed in the inner portion of the light collecting body 321 and changes a propagation direction of reflected light L2 toward the bottom surface of the light collecting body 321. The propagation direction of light L2 is changed to be directed to the light sensor 310 at the rear of the light collecting member 320_5, which can measure luminance.

In an exemplary embodiment, the light input surface LS1 of the light collecting body 321 is a top surface and the light output surface LS2 thereof is a portion of a bottom surface. Thus, if the light collecting member 320_5 further includes a reflective member 323_1, the reflective member 323_1 can be disposed on all side surfaces and that portion of the bottom surface other than the light output surface LS2, of the light collecting body 321.

Figure 15:
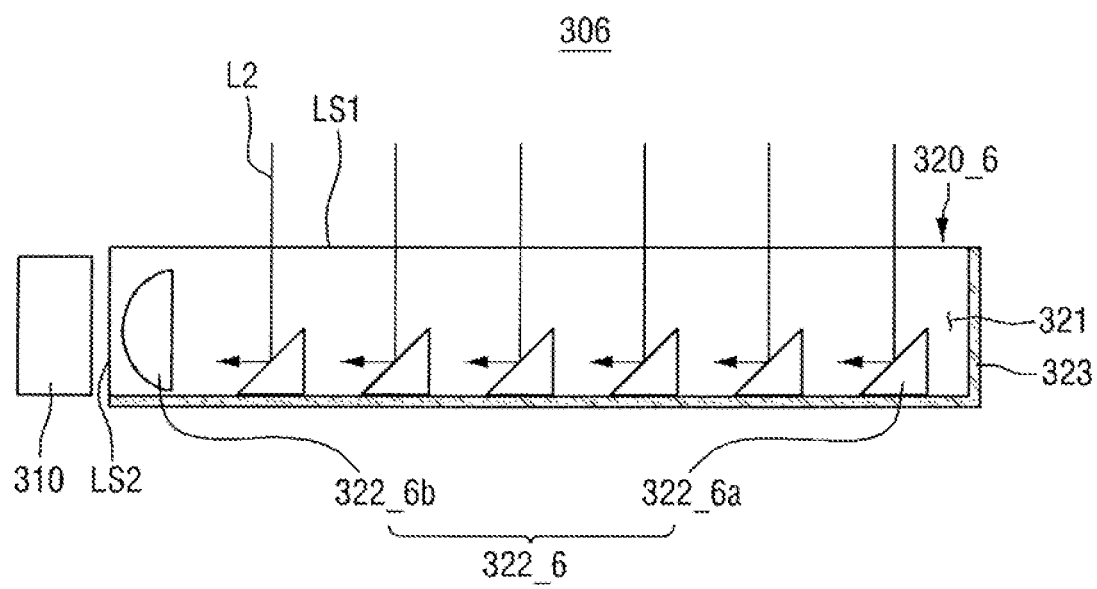
FIG. 15 is a cross-sectional view of a light sensing member of an organic light-emitting diode display device according to another exemplary embodiment of the present disclosure.

FIG. 15 is a cross-sectional view of a light sensing member of an organic light-emitting diode display device according to another exemplary embodiment of the present disclosure.

Referring to FIG. 15, a light sensing member 306 according to an exemplary embodiment differs from the embodiment of FIG. 9 in that there is a light-modulating structure 322_6 inside the light collecting body 321 that further includes a light path changing structure 322_6a, such as the prism pattern of FIG. 9, that changes a light path to a horizontal direction, as well as a light-focusing structure 322_6b. The light path changing structure 322_6a reflects leakage light L2 toward one side of the light collecting body 321, like the embodiment of FIG. 9. The light-focusing structure 322_6b is disposed between the light sensor 310 and the light path changing structure 322_6a. The light-focusing structure 322_6b can focus light L2 received from the light path changing structure 322_6a toward one point to thereby provide light to the light sensor 310. In this manner, focusing light improves light-collection and reduces an area of an active region of the light sensor 310.

The light-focusing structure 322_6b may be a micro-lens, a lenticular lens, a concave lens, a convex lens, etc.

Figure 16:
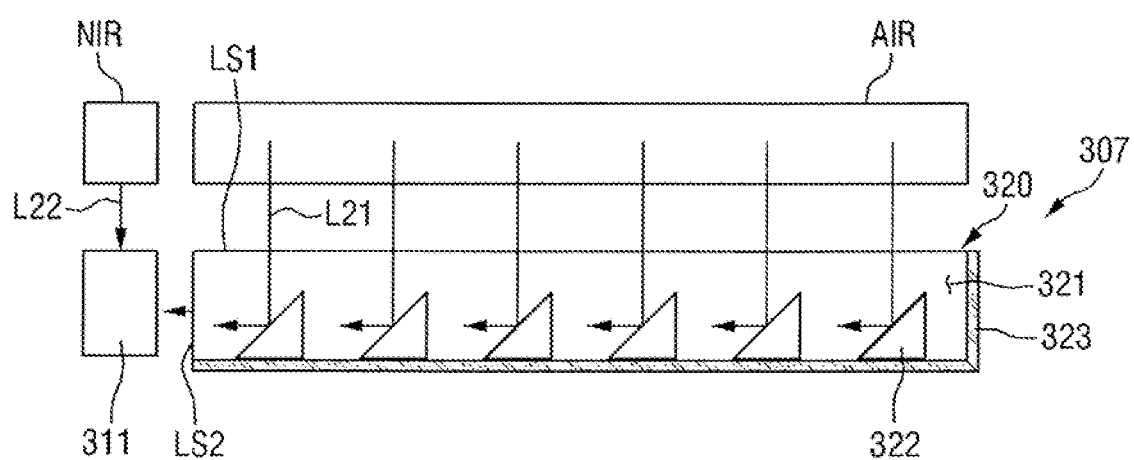
FIG. 16 is a cross-sectional view of a light sensing member of an organic light-emitting diode display device according to another exemplary embodiment of the present disclosure.

FIG. 16 is a cross-sectional view of a light sensing member of an organic light-emitting diode display device according to another exemplary embodiment of the present disclosure.

According to an embodiment of FIG. 16, a light sensor 311 of a light sensing member 307 has two or more light-receiving surfaces.

Referring to FIG. 16, the light collecting member 320 of the light sensing member 307 is overlapped by a sensing-object, such as the afterimage-expected region AIR of FIG. 4. In addition, the light sensor 311 is disposed adjacent to one side of the light collecting member 320 while being overlapped by a comparative region NIR, a normal image region.

According to an embodiment, leakage light L21 received from the afterimage-expected region AIR is transmitted to the light sensor 311 through the light collecting member 320 in a manner identical to that of the embodiment of FIG. 4. However, leakage light L22 received from the comparative region NIR does not pass through the light collecting member 320 and is provided directly to the light sensor 311. The light sensor 311 has two or more light-receiving surfaces and accordingly, can sense both types of leakage light L21 and L22.

According to an embodiment, the comparative region NIR includes a reference pixel for determining a degradation degree in the afterimage-expected region AIR. When light is emitted sequentially from the reference pixel and pixels in the afterimage-expected region AIR, the degradation degree can be more precisely compared and analyzed.

For example, first, a data signal is applied to the reference pixel of the comparative region NIR, and light is emitted and detected. Then, a data signal is applied to the pixels in the afterimage-expected region AIR, and light is emitted and detected. Thereafter, the relative intensities of light detected in the comparative region NIR and the afterimage-expected region AIR are compared to analyze the degradation degree of the afterimage-expected region AIR, thereby generating a compensation signal.

Figure 17:
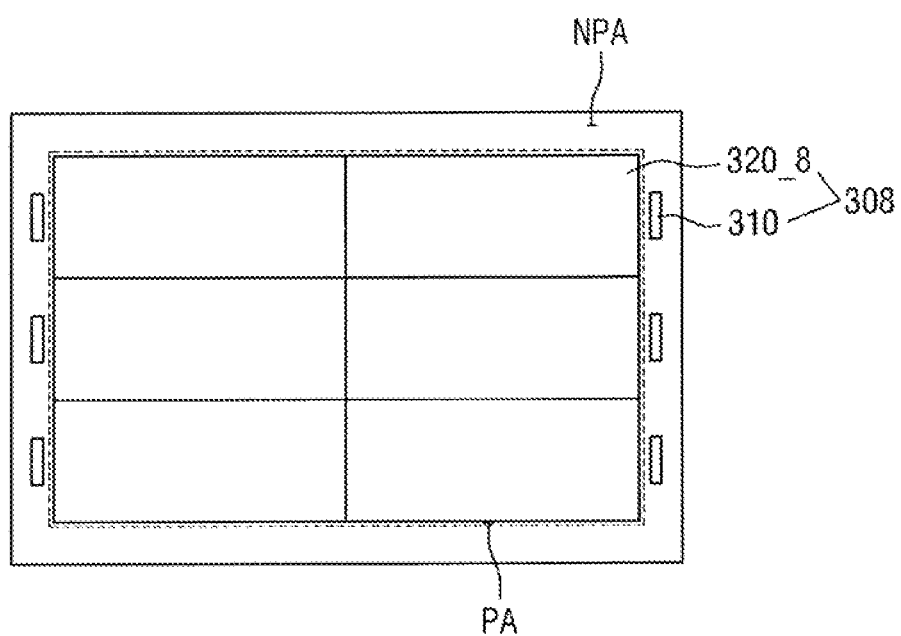
FIG. 17 is a rear view of an organic light-emitting diode display device according to another exemplary embodiment of the present disclosure.

FIG. 17 is a rear view of an organic light-emitting diode display device according to another exemplary embodiment of the present disclosure.

Referring to FIG. 17, an organic light-emitting diode display device 502 according to the exemplary embodiment differs from the embodiment of FIG. 3 in that there are a plurality of light sensing members 308 disposed to cover the entirety of the display region PA.

According to an embodiment, adjacent light collecting members 320_8 of the light sensing members 308 are not be spaced apart from each other. The light sensor 310 is disposed in one side of the light collecting members 320_8. The light sensor 310 is disposed in the non-display region NPA. Further, the light sensor 310 protrudes outward from a side of the first substrate 100.

In an embodiment, the light collecting members 320_8 are disposed over the entire display region PA of the first substrate, to measure light leakage from all pixel regions.

Figure 18:
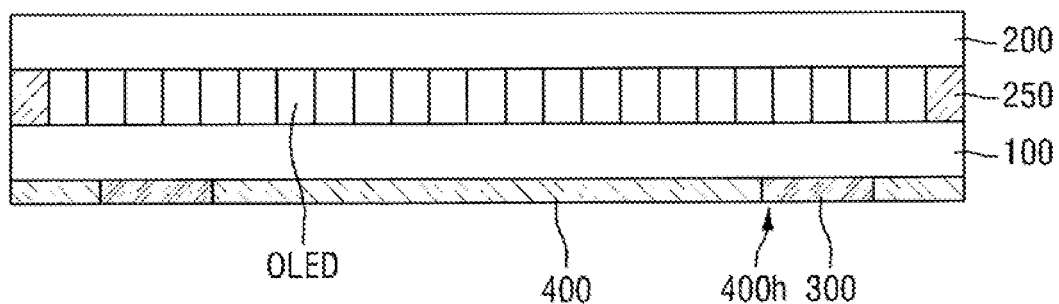
FIG. 18 is a cross-sectional view of an organic light-emitting diode display device according to another exemplary embodiment of the present disclosure.

FIG. 18 is a cross-sectional view of an organic light-emitting diode display device according to another exemplary embodiment of the present disclosure.

Referring to FIG. 18, an organic light-emitting diode display device 503 according to an exemplary embodiment includes a heat radiating member 400 disposed on a rear surface of the first substrate 100. The heat radiating member 400 can emit heat generated from an organic light-emitting device (OLED) or a driving chip, to the external environment.

According to an embodiment, the heat radiating member 400 contains a high thermal conductive material. For example, the heat radiating member 400 may contain a metal such as aluminum, copper, silver, etc., or a material such as graphite, grapheme, etc.

According to embodiments, the heat radiating member 400 may be a heat radiating panel, a heat radiating sheet, a heat radiating film, a heat radiating layer or the like. In addition, the heat radiating member 400 may include several stacked sheets of heat radiating material.

According to an embodiment, the heat radiating member 400 is adhered to the rear surface of the first substrate 100. The heat radiating member 400 is attached to the rear surface of the first substrate 100. The heat radiating member 400 may cover the entirety of the rear surface of the first substrate 100 or may be disposed in portions of the rear surface from which light is emitted.

According to an embodiment, if the heat radiating member 400 overlaps the light sensing member 300, the heat radiating member 400 includes a hole 400h allowing the light sensing member 300 to be inserted therein. The light sensing member 300 can be inserted into the hole 400h of the heat radiating member 400 and can be adhered to the rear surface of the first substrate 100.

Figure 19:
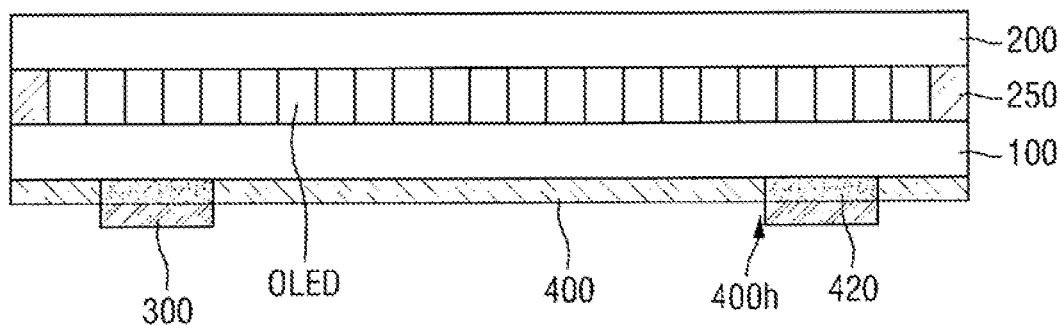
FIG. 19 is a cross-sectional view of an organic light-emitting diode display device according to another exemplary embodiment of the present disclosure.

FIG. 19 is a cross-sectional view of an organic light-emitting diode display device according to another exemplary embodiment of the present disclosure.

According to an embodiment of FIG. 19, the light sensing member 300 of an organic light-emitting diode display device 504 is attached to the rear surface of the first substrate 100 by an adhesive member 420. In an exemplary embodiment, so that leakage light emitted to the rear surface of the first substrate 100 can pass through the adhesive member 420 to the light sensing member 300, the adhesive member 420 is formed of a transparent material. The adhesive member 420 may contain an adhesive material or a bonding material and may be provided as an adhesive layer, a double-sided adhesive tape, etc.

FIG. 19 illustrates a case in which a thickness of the adhesive member 420 is identical to a thickness of the heat radiating member 400, and the light sensing member 300 further protrudes to the rear from the heat radiating member 400; however, embodiments are not limited thereto, and the thicknesses and relative positions in the rear direction of the members can be variously modified.

Figure 20:
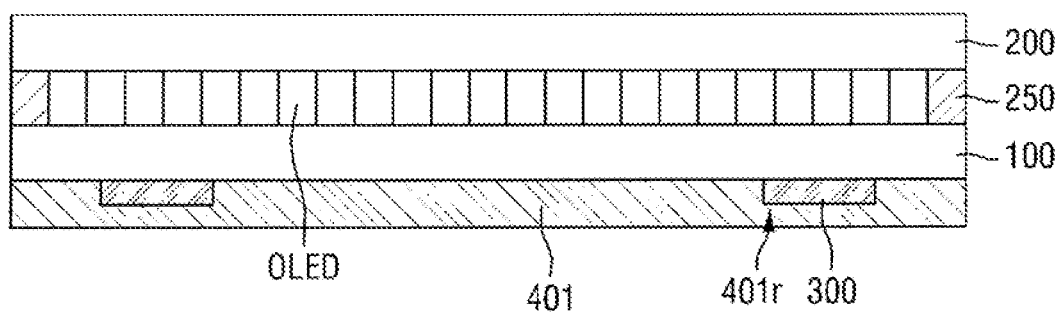
FIG. 20 is a cross-sectional view of an organic light-emitting diode display device according to another exemplary embodiment of the present disclosure.

FIG. 20 is a cross-sectional view of an organic light-emitting diode display device according to another exemplary embodiment of the present disclosure.

Referring to FIG. 20, an organic light-emitting diode display device 505 according to an exemplary embodiment differs from the embodiment of FIG. 18 in that a heat radiating member 401 includes a recessed groove 401r so that the light sensing member 300 can be inserted into the groove 401r. The light sensing member 300 is enclosed by the rear surface of the first substrate 100 and the heat radiating member 401.

According to a modified embodiment, a light sensing member is attached to the rear surface of the first substrate by an adhesive member, as in the embodiment of FIG. 19.

As set forth above, a light sensing member of an organic light-emitting diode display device according to exemplary embodiments of the present disclosure, can directly receive leakage light even for a top emission type organic light-emitting diode display device, to effectively detect light without loss of leakage light.

While exemplary embodiments have been shown and described above, it will be apparent to those skilled in the art that modifications and variations could be made without departing from the spirit and scope of embodiments of the present disclosure as defined by the appended claims.

What is claimed is:

1. A light-emitting display device, comprising:
a first substrate that includes a display region with a plurality of pixels and a non-display region in a periphery of the display region;
a first electrode disposed on a first surface of the first substrate;
a light-emitting layer disposed on the first electrode;
a second electrode disposed on the light-emitting layer; and
a light sensing member disposed on a second surface of the first substrate, the light sensing member overlapping the display region, the second surface of the first substrate being opposite to the first surface of the first substrate,
wherein the light sensing member includes a light sensor and a light collecting member that changes a path of incident light to direct the incident light to the light sensor.

2. The light emitting display device of claim 1, wherein the light collecting member includes a light path changing structure, and
wherein the light path changing structure overlaps the display region.

3. The light emitting display device of claim 2, wherein the light path changing structure includes a prism pattern.

4. The light emitting display device of claim 3, wherein the prism pattern includes a sloped surface, and an inclination angle of the sloped surface is an acute angle.

5. The light emitting display device of claim 2, wherein the light collecting member further includes a light-focusing structure disposed between the light path changing structure and the light sensor.

6. The light emitting display device of claim 5, wherein the light-focusing structure overlaps the display region.

7. The light emitting display device of claim 6, wherein the light-focusing structure includes at least one of a microlens, a lenticular lens, a concave lens, or a convex lens.

8. The light emitting display device of claim 1, further comprising a plurality of light sensing members that are spaced apart from each other.

9. The light emitting display device of claim 1, wherein the display region includes a central portion and a circumferential portion that surrounds the central portion, and
the light sensing member is disposed in the circumferential portion of the display region.

10. The light emitting display device of claim 1, further comprising a heat radiating member disposed on the second surface of the first substrate.

11. The light emitting display device of claim 10, wherein the heat radiating member includes a hole, and
the light sensing member is inserted into the hole and is disposed adjacent to the second surface of the first substrate.

* * * * *